United States Patent
Yoo et al.

(10) Patent No.: US 10,854,707 B2
(45) Date of Patent: Dec. 1, 2020

(54) SEMICONDUCTOR DEVICE INCLUDING DIELECTRIC STRUCTURE HAVING FERROELECTRIC LAYER AND NON-FERROELECTRIC LAYER

(71) Applicant: SK hynix Inc., Icheon-si (KR)

(72) Inventors: Hyangkeun Yoo, Seongnam-si (KR); Se Ho Lee, Yongin-si (KR); Jae Gil Lee, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 16/536,044

(22) Filed: Aug. 8, 2019

(65) Prior Publication Data
US 2020/0212168 A1    Jul. 2, 2020

(30) Foreign Application Priority Data
Dec. 27, 2018  (KR) .................. 10-2018-0171071

(51) Int. Cl.
*H01L 49/02*    (2006.01)
*H01L 29/51*    (2006.01)
*H01L 29/78*    (2006.01)

(52) U.S. Cl.
CPC .............. *H01L 28/56* (2013.01); *H01L 28/60* (2013.01); *H01L 29/513* (2013.01); *H01L 29/516* (2013.01); *H01L 29/517* (2013.01); *H01L 29/518* (2013.01); *H01L 29/78391* (2014.09)

(58) Field of Classification Search
CPC ....... H01L 28/56; H01L 28/60; H01L 29/513; H01L 29/78391; H01L 29/517; H01L 29/518; H01L 29/516
See application file for complete search history.

(56) References Cited

U.S. PATENT DOCUMENTS

| 9,978,868 B2 | 5/2018 | Lai et al. | |
| 2007/0096180 A1* | 5/2007 | Yamakawa | H01L 27/11502 257/295 |
| 2017/0345831 A1* | 11/2017 | Chavan | H01L 29/40111 |

FOREIGN PATENT DOCUMENTS

KR    10-2014-0004855 A    1/2014

OTHER PUBLICATIONS

Wong et al.; A possible mechanism of anomalous shift and asymmetric hysteresis behavior of ferroelectric thin films; Appl. Phys. Lett. 86, 042901 2005. (Year: 2005).*
I. B. Misirlioglu; Asymmetric hysteresis loops and smearing of the dielectric anomaly at the transition temperature due to space charges in ferroelectric thin films; J. Appl. Phys. 108, 034105 (2010). (Year: 2010).*
Setter; Ferroelectric thin films: Review of materials, properties, and applications; J. Appl. Phys. 100, 051606 (2006) (Year: 2006).*

* cited by examiner

*Primary Examiner* — Syed I Gheyas

(57) ABSTRACT

A semiconductor device according to an embodiment includes a first electrode, a dielectric layer structure disposed on the first electrode and having a ferroelectric layer and a non-ferroelectric layer, and a second electrode disposed on the dielectric structure. The ferroelectric layer has positive and negative coercive electric fields having different absolute values. The dielectric structure has a non-ferroelectric property.

20 Claims, 18 Drawing Sheets

SEMICONDUCTOR DEVICE INCLUDING DIELECTRIC STRUCTURE HAVING FERROELECTRIC LAYER AND NON-FERROELECTRIC LAYER

CROSS-REFERENCE TO RELATED APPLICATION

The present application claims priority under 35 U.S.C 119(a) to Korean Patent Application No. 10-2018-0171071, filed on Dec. 27, 2018, which is herein incorporated by reference in its entirety.

BACKGROUND

1. Technical Field

Various embodiments of the present disclosure generally relate to a semiconductor device and, more particularly, to a semiconductor device including a dielectric structure having a ferroelectric layer and a non-ferroelectric layer.

2. Related Art

As critical sizes of semiconductor chip design are decreasing, the sizes of capacitor elements and transistor elements in the semiconductor chip are also decreasing. However, the capacitance required for a capacitor element and a gate dielectric layer of a transistor element is required to be maintained to a predetermined value or higher for performance. Therefore, various methods for increasing the capacitance of the dielectric layer have been studied.

Typically, attempts to apply a high dielectric material to the dielectric layer have continued, however, in recent years, the dielectric layer to which the high dielectric material is applied has reached a limit to increased capacitance due to the generation of leakage current.

SUMMARY

An embodiment of the present disclosure provides a dielectric layer having a high capacitance applied to a dielectric layer of a capacitor element or to a gate dielectric layer of a transistor element.

A semiconductor device according to an aspect of the present disclosure includes a first electrode, a dielectric structure disposed on the first electrode and having a ferroelectric layer and a non-ferroelectric layer, and a second electrode disposed on the dielectric structure. The ferroelectric layer has a positive and a negative coercive electric fields of different absolute values. The dielectric structure has a non-ferroelectric property.

A semiconductor device according to another aspect of the present disclosure includes a gate dielectric structure disposed on a channel region of a substrate of the device. The gate dielectric structure includes a ferroelectric layer and a non-ferroelectric layer. The ferroelectric layer has a first region and a first region thickness generated by a first region concentration gradient of oxygen vacancies which trap negative charge and polarize a corresponding positive charge and generate an internal electric field. The gate dielectric structure has a paraelectric property and a controlled capacitance by a capacitance matching of the ferroelectric layer and the non-ferroelectric layer.

DETAILED DESCRIPTION

Figure 1A:
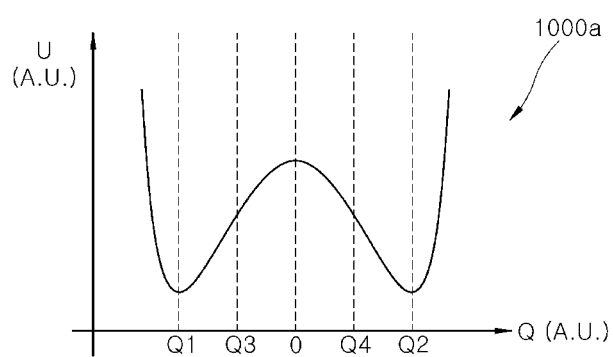
FIGS. 1A to 1C are graphs schematically illustrating dielectric characteristics of a conventional dielectric material.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

Figure 1B:
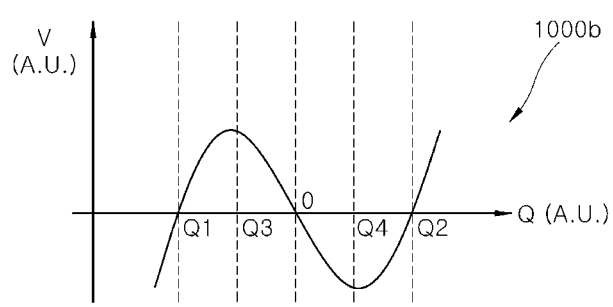
Figure 1C:
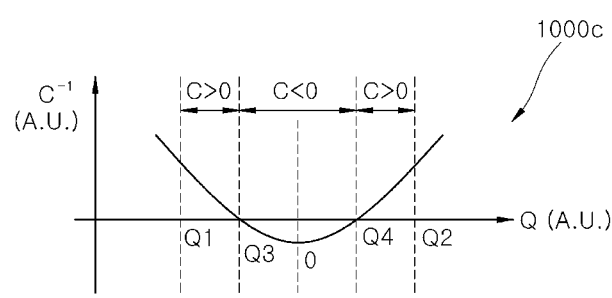

FIGS. 1A to 1C are graphs schematically illustrating dielectric characteristics of a conventional dielectric material. Specifically, a first graph 1000a of FIG. 1A represents an energy U according to a change in charge Q of the ferroelectric material. A second graph 1000b of FIG. 1B represents an electric potential V according to a change in charge Q of the ferroelectric material. A third graph 1000c of FIG. 1C represents a capacitance C according to a change in charge Q of the ferroelectric material.

Referring to the first graph 1000a of FIG. 1A, an electrostatic energy of the ferroelectric material may have the lowest value in a first charge amount Q1 and a second charge amount Q2. Accordingly, when an external voltage is applied to both ends of the ferroelectric material, the ferroelectric material can stably have a pair of remanent polarization states corresponding to the first charge amount Q1 and the second charge amount Q2, respectively.

The second graph 1000b of FIG. 1B is a graph obtained by differentiating the first graph 1000a with an electric charge amount. That is, the second graph 1000b may follow the relation expressed by the equation V=dU/dQ. Here, V may be an electric potential of a ferroelectric layer, U may be an electrostatic energy of a ferroelectric layer, and Q may be a charge amount in a ferroelectric layer.

The third graph 1000c of FIG. 1C is a graph obtained by differentiating the second graph 1000b with an electric charge amount. That is, the third graph 1000c may follow the relation expressed by the equation $C^{-1}=dV/dQ$. Here, C may be a capacitance of a ferroelectric layer, V may be an electric potential of a ferroelectric layer, U may be an electrostatic energy of a ferroelectric layer, and Q may be a charge amount in a ferroelectric layer. Meanwhile, a section in which the capacitance C has a negative value may exist between a third charge amount Q3 and a fourth charge amount Q4 in the third graph 1000c. In this section, it can be said that the ferroelectric material has a negative capacitance. The capacitance C may have a positive value in the remaining sections.

Figure 2:
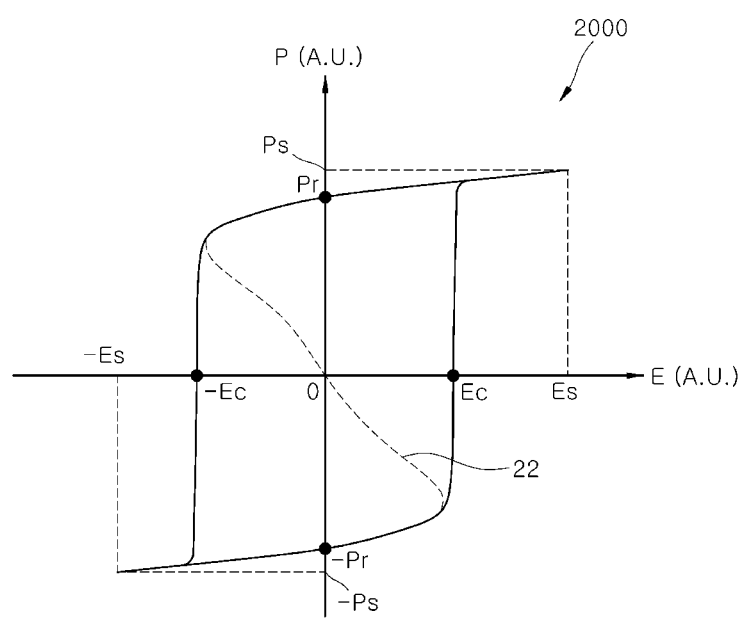
FIG. 2 is a ferroelectric hysteresis loop exhibited by conventional ferroelectric materials.

FIG. 2 is a ferroelectric hysteresis loop represented by conventional ferroelectric materials. Specifically, FIG. 2 may be a hysteresis loop 2000 obtained by sequentially forming a first electrode, a ferroelectric material layer and a second electrode. A polarization of the ferroelectric material layer is measured by applying an electric field between the first and second electrodes.

Referring to the hysteresis loop 2000 of FIG. 2, the ferroelectric material may have first and second remanent polarization Pr and −Pr and first and second coercive electric fields Ec and −Ec. The first and second remanent polarization Pr and −Pr, and the first and second coercive electric fields Ec and −Ec may have the same magnitude. Likewise, the ferroelectric material may have corresponding first and second saturation polarization Ps and −Ps at first and second saturation electric fields Es and −Es. The first and second saturation electric fields Es and −Es, and the first and second saturation polarization Ps and −Ps may also have the same magnitude.

Referring again to FIG. 2, when the ferroelectric material has the second remanent polarization −Pr, an electric field which increases in a positive direction from 0 may be applied to the ferroelectric material. In some embodiments, when the electric field reaches the first coercive electric field Ec, the polarization of the ferroelectric material may change along a new polarization path 22 without changing along the hysteresis loop 2000. The polarization change along the new polarization path 22 may be caused by a negative capacitance characteristic of the ferroelectric material described above with reference to the first to third graphs 1000a, 1000b and 1000c of FIGS. 1A to 1C. That is, in the new polarization path 22, a capacitance of the ferroelectric material may follow a relation expressed by the equation C=dQ/dV<0. Here, C may be a capacitance, Q may be a charge amount, and V may be an electric field. When the ferroelectric material has the negative capacitance between Q3 and Q4 as shown in FIG. 1C, the ferroelectric material may have an unstable electrostatic energy U as shown in FIG. 1A. Accordingly the ferroelectric material has an unstable electrostatic energy U, the polarization change may follow the new polarization path 22. As described above, the ferroelectric material may have a stable electrostatic energy U at the first charge amount Q1 and the second charge amount Q2.

Likewise, when the ferroelectric material has the first remanent polarization Pr, an electric field which increases in a negative direction from 0 may be applied to the ferroelectric material. In some embodiments, when the electric field reaches the second coercive electric field −Ec, the polarization of the ferroelectric material may change along the new polarization path 22 without changing along the hysteresis loop 2000. The polarization change along the new polarization path 22 may be caused by the negative capacitance characteristic of the ferroelectric material.

Meanwhile, when a magnitude of the electric field applied to the ferroelectric material is smaller than an absolute value of the first or second coercive electric field Ec or −Ec, the ferroelectric material may have a capacitance that defines a value obtained by dividing the absolute value of the first or second remanent polarization Pr or −Pr by the absolute value of the first or second coercive electric field Ec or −Ec as a maximum value.

Figure 3:
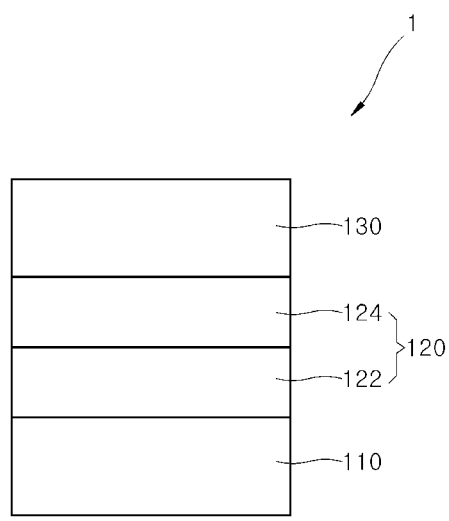
FIG. 3 is a cross-sectional view schematically illustrating a semiconductor device according to a comparative example of the present disclosure.
Figure 4A:
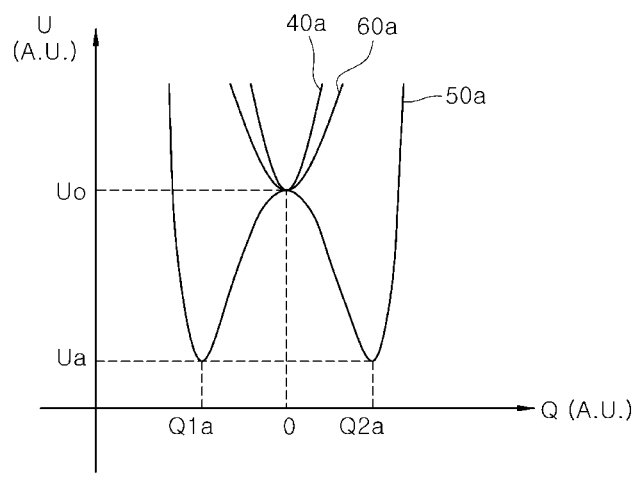
FIGS. 4A and 4B are graphs illustrating a relationship between charge Q and energy U for a dielectric layer structure in a semiconductor device according to a comparative example of the present disclosure.
Figure 4B:
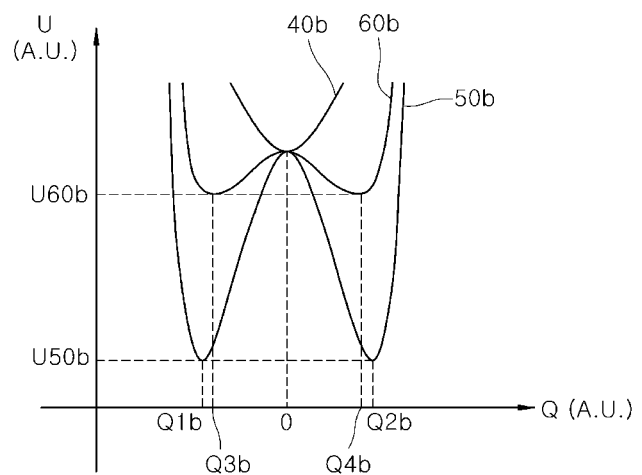

FIG. 3 is a cross-sectional view schematically illustrating a semiconductor device according to a comparative example of the present disclosure. FIGS. 4A and 4B are graphs illustrating a relationship between charge Q and energy U for a dielectric structure in the semiconductor device according to the comparative example of the present disclosure.

Referring to FIG. 3, the semiconductor device 1 may include a first electrode 110, a dielectric structure 120 and a second electrode 130. The dielectric structure 120 may include a non-ferroelectric layer 122 and a ferroelectric layer 124.

The first and second electrodes 110 and 130 may each be an electrode containing a conductive material. The conductive material may include, for example, doped silicon (Si), titanium (Ti), titanium nitride (TiN), and so on. The non-ferroelectric layer 122 may have a paraelectric property. That is, when an external electric field is applied to the non-ferroelectric layer 122, polarization due to a dipole may be generated in the non-ferroelectric layer 122. When the electric field is removed, the polarization may also disappear. As an example, the non-ferroelectric layer 122 may include, for example, silicon oxide, silicon nitride, silicon oxynitride, and so on.

The ferroelectric layer 124 may include a ferroelectric material having remanent polarization. The ferroelectric material may be substantially the same as the ferroelectric material described above with reference to FIGS. 1A to 1C and 2. The ferroelectric material may, for example, include ferroelectric hafnium oxide, ferroelectric zirconium oxide, and ferroelectric hafnium zirconium oxide.

Meanwhile, although not necessarily limited to one structure, according to any one of a plurality of various structures, a polarization electric field due to ferroelectric polarization can be formed in the ferroelectric layer 124. When the non-ferroelectric layer 122 and the ferroelectric layer 124 form an interface, a high density first charge generated by the polarization electric field may be distributed in the ferroelectric layer 124 adjacent to the interface. Additionally, a second charge having an opposite polarity to the first charge may be distributed in the non-ferroelectric layer 122 adjacent to the interface. At this time, if an amount of the second charge does not cancel all of the high density first charge, a depolarization electric field can be formed in the ferroelectric layer 124 in a direction opposite to the polarization electric field by the first charge that is not canceled.

Meanwhile, when the polarization electric field and the depolarization electric field of the non-ferroelectric layer 122 and the ferroelectric layer 124 cancel each other, an external operation voltage may be applied to the non-ferroelectric layer 122 only. That is, the ferroelectric layer 124 may substantially loose function as a dielectric layer, and the non-ferroelectric layer 122 may function as the dielectric layer. At this time, a capacitance of the ferroelectric structure 120 may be greater than a capacitance of the non-ferroelectric layer 122 itself. As described above, controlling the non-ferroelectric layer 122 and the ferroelectric layer 124 to have a condition that the polarization electric field and the depolarization electric field cancel each other can be referred to as "capacitance matching the non-ferroelectric layer 122 and the ferroelectric layer 124".

In this comparative example, to perform capacitance matching, types of the non-ferroelectric layer 122 and the ferroelectric layer 124 that are disposed between the first and the second electrodes 110 and 130 may be first determined. Subsequently, thicknesses of the determined non-ferroelectric layer 122 and the ferroelectric layer 124 may be controlled. Through these steps, a dielectric structure 120 having an improved capacitance can be formed.

According to the third graph 1000*c* illustrated in FIG. 1C, a section in which the ferroelectric material has a negative capacitance needs to be suppressed in order to suppress the ferroelectric polarization characteristic of the ferroelectric layer 124.

FIG. 4A is a graph explaining the relation between charge and energy when the polarization electric field and the depolarization electric field are sufficiently canceled. In FIG. 4A, a first graph 40*a* is a charge-energy graph for the non-ferroelectric layer 122, a second graph 50*a* is a charge-energy graph for the ferroelectric layer 124, and a third graph 60*a* is a charge-energy graph for the dielectric structure 120.

Referring further to FIG. 4A, through capacitance matching of the non-ferroelectric layer 122 and the ferroelectric layer 124, a ferroelectric property of the ferroelectric layer 124 shown in the second graph 50*a* can be removed in the third graph 60*a* of the dielectric structure 120. That is, in the second graph 50*a*, a pair of energy valleys having a lowest energy Ua may appear at the first and second charge amounts Q1*a* and Q2*a*, whereas in the third graph 60*a*, one energy valley having the lowest energy U0 may appear at a point where the charge amount is zero. Meanwhile, the lowest energy Ua of the second graph 50*a* corresponds to the energy of the first and second remanent polarization Pr and −Pr. Therefore, a ferroelectric material characterized by the hysteresis loop of FIG. 2 including the ferroelectric layer 124, displays a ferroelectric polarization property.

FIG. 4B is a graph explaining the relation between charge and energy when the polarization electric field and the depolarization electric field are not sufficiently canceled. In FIG. 4B, a first graph 40*b* is a charge-energy graph for the non-ferroelectric layer 122, a second graph 50*b* is a charge-energy graph for the ferroelectric layer 124, and a third graph 60*b* is a charge-energy graph for the dielectric structure 120.

Referring to FIG. 4B, as a result of the incomplete capacitance matching for the non-ferroelectric layer 122 and the ferroelectric layer 124, the ferroelectric property characterized by the pair of energy valleys shown in the second graph 50*b*, is not sufficiently removed in the third graph 60*b*. That is, similar to the appearance of a pair of energy valleys having the lowest energy U50*b* at the first and second charge amounts Q1*b* and Q2*b* in the second graph 50*b*, a pair of energy valleys having the lowest energy U60*b* may appear at third and fourth charge amounts Q3*b* and Q4*b* in the third graph 60*b*. The incomplete capacitance matching may occur, for example, when the thicknesses of the non-ferroelectric layer 122 and the ferroelectric layer 124 are controlled such that a capacitance of the ferroelectric layer 124 is less than a capacitance of the non-ferroelectric layer 122.

According to this comparative example, a method of suppressing the ferroelectric property of the ferroelectric layer 124 and increasing the capacitance of the dielectric structure 120 is disclosed. The capacitance of the non-ferroelectric layer 122 is controlled by the thicknesses of the non-ferroelectric layer 122 and the ferroelectric layer 124, which also control the polarization electric field and the depolarization electric field.

Figure 5:
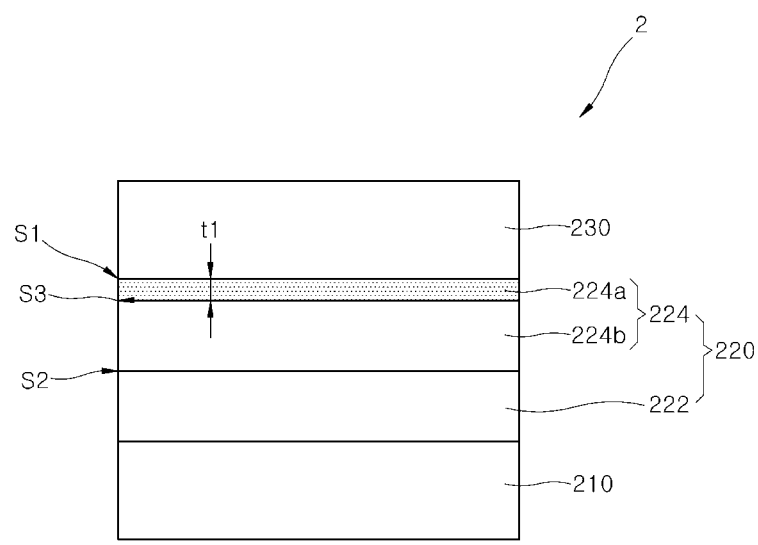
FIG. 5 is a cross-sectional view schematically illustrating a semiconductor device according to an embodiment of the present disclosure.
Figure 6:
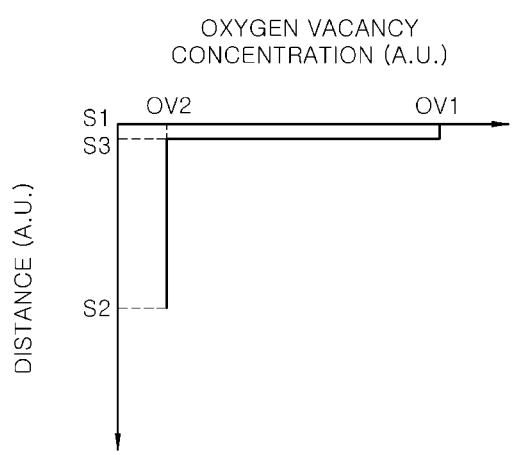
FIG. 6 is a graph schematically illustrating the distribution of oxygen cavities in a ferroelectric layer of a semiconductor device according to an embodiment of the present disclosure.
Figure 7:
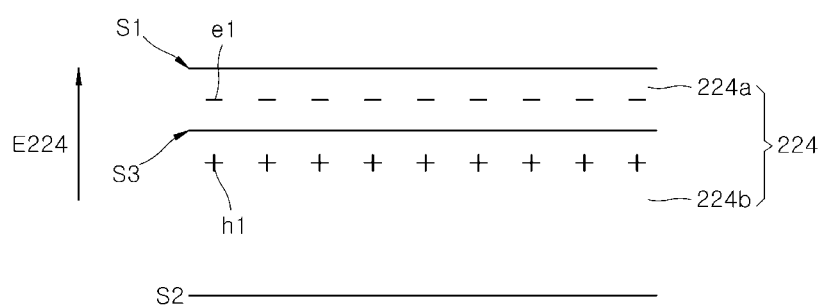
FIG. 7 is a view schematically illustrating an internal electric field due to the distribution of oxygen cavities in a ferroelectric layer of a semiconductor device according to an embodiment of the present disclosure.
Figure 8:
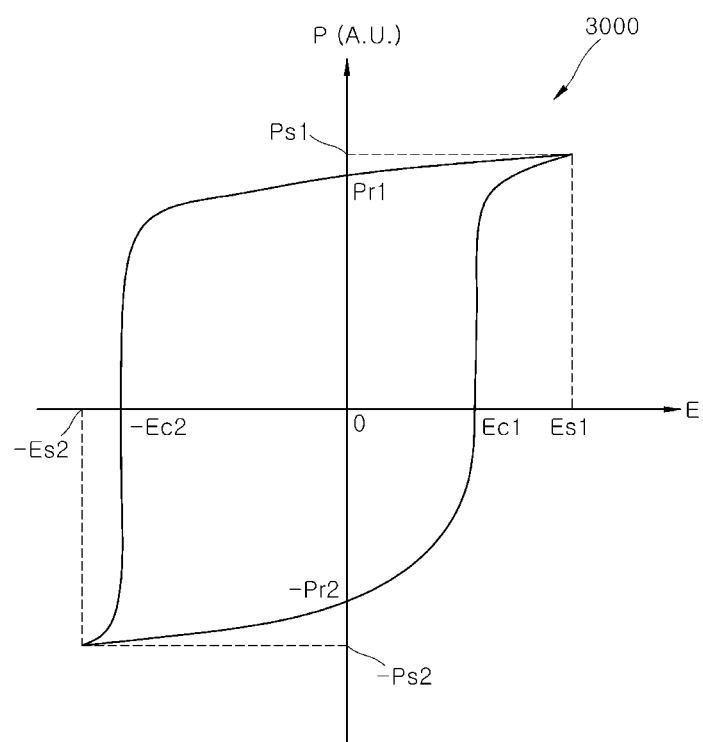
FIG. 8 is a hysteresis loop for a ferroelectric layer of a semiconductor device according to an embodiment of the present disclosure.
Figure 9:
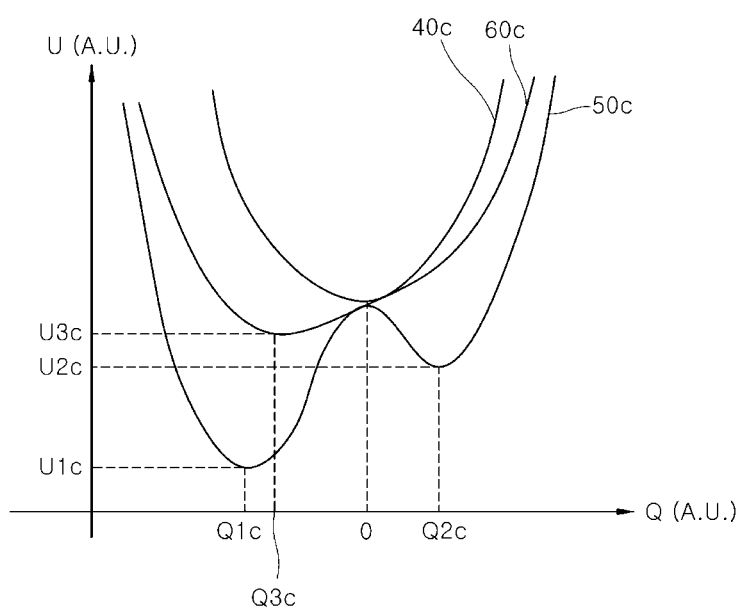
FIG. 9 is a graph illustrating a relationship of charge Q and energy U for a dielectric structure in a semiconductor device according to an embodiment of the present disclosure.

FIG. 5 is a cross-sectional view schematically illustrating a semiconductor device according to an embodiment of the present disclosure. As an example, the semiconductor device may be a capacitor element. FIG. 6 is a graph schematically illustrating the distribution of oxygen cavities in a ferroelectric layer of the semiconductor device according to the embodiment of the present disclosure. FIG. 7 is a view schematically illustrating an internal electric field due to the distribution of oxygen cavities in the ferroelectric layer of the semiconductor device according to the embodiment of the present disclosure. FIG. 8 is a hysteresis loop of the ferroelectric layer of the semiconductor device according to the embodiment of the present disclosure. FIG. 9 is a graph illustrating a relationship between charge Q and energy U for a dielectric structure in the semiconductor device according to the embodiment of the present disclosure.

Referring to FIG. 5, the semiconductor device 2 may include a first electrode 210, a dielectric structure 220 and a second electrode 230. The dielectric structure 220 may include a non-ferroelectric layer 222 and a ferroelectric layer 224. The ferroelectric layer 224 may include a first region 224*a* and a second region 224*b* that have different oxygen vacancy concentrations. The ferroelectric layer 224, for example, the first region 224*a*, and the second electrode 230 may form a first interface S1. The non-ferroelectric layer 222 and the ferroelectric layer 224 may form a second interface S2. The first region 224*a* and the second region 224*b* may form a third interface S3.

The first electrode 210 and the second electrode 230 may each include a conductive material. As an example, the conductive material may include tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, doped silicon, or a combination of two or more thereof.

The non-ferroelectric layer 222 may, for example, have a paraelectric property or an anti-ferroelectric property. That is, when an external electric field is applied to the non-ferroelectric layer 222, polarization due to a dipole may be formed in the non-ferroelectric layer 222, and when the external electric field is removed, the polarization may disappear. In other words, the non-ferroelectric layer 222 may not have remanent polarization. As an example, the non-ferroelectric layer 222 may include, for example, silicon oxide, silicon nitride, silicon oxynitride and so on. As another example, the non-ferroelectric layer 222 may include, for example, aluminum oxide, hafnium oxide, zirconium oxide, and hafnium zirconium oxide. Here, if the hafnium oxide, zirconium oxide, and hafnium zirconium oxide have a crystal structure of an orthorhombic crystal system, they can have a ferroelectric property. If the hafnium oxide, zirconium oxide, and hafnium zirconium oxide have a crystal structure of monoclinic crystal system or tetragonal crystal system, they may not have the ferroelectric property. In this embodiment, the non-ferroelectric layer 222 may include at least one of hafnium oxide, zirconium oxide, and hafnium zirconium oxide having a crystal structure of the monoclinic crystal system or the tetragonal crystal system.

The ferroelectric layer 224 may include a ferroelectric material having a ferroelectric property described above with reference to FIGS. 1A to 1C and 2. The ferroelectric layer 224 may, for example, include hafnium oxide, zirconium oxide, hafnium zirconium oxide or a combination of two or more thereof. Here, the hafnium oxide, zirconium oxide, and hafnium zirconium oxide may have a crystal structure of the orthorhombic crystal system having a ferroelectric property.

In an embodiment, the ferroelectric layer 224 may include a first region 224a disposed in a region adjacent to the second electrode 230 and a second region 224b disposed outside the first region 224a. The second region 224b may be distal the second electrode 230 and proximal the first region 224a. Here, the concentration of the oxygen vacancy of the first region 224a may be higher than the concentration of the oxygen vacancy of the second region 224b.

Referring to FIGS. 5 and 6, the first region 224a of the ferroelectric layer 224 may have a first oxygen vacancy value OV1. That is, the oxygen vacancies may maintain the first oxygen vacancy value OV1 in a region from the first interface S1 to the third interface S3 corresponding to a first depth t1. The concentration of the oxygen vacancy in a region where the depth from the first interface S1 is greater than the first depth t1, that is, in the second region 224b, can maintain a second oxygen vacancy value OV2 that is lower than the first oxygen vacancy value OV1. In an embodiment, the second oxygen vacancy value OV2 may correspond to an inevitable minimum amount of oxygen vacancies that may be present in the ferroelectric layer 224.

As the ferroelectric layer 224 has the concentration distribution of oxygen vacancies illustrated in FIG. 6, high density trap sites due to oxygen vacancies can be generated in the first region 224a. Since the trap sites can trap negative charges, as illustrated in FIG. 7, polarization of a positive charge h1 and a negative charge e1 can occur with the third interface S3 as a boundary. Due to the polarization, an internal electric field E224 can be formed in the ferroelectric layer 224. As an example, a thickness of the first region 224a, that is, the first depth t1 may be about ⅒ to ½ of a thickness of the ferroelectric layer 224. As an example, the first depth t1 may be about 1 to 2 nanometer (nm). In an embodiment, when the ferroelectric layer 224 has a thickness of 2 to 10 nanometer (nm), a ratio of the first oxygen vacancy value OV1 to the second oxygen vacancy value OV2 may be at least 5 or greater.

According to an embodiment, the first region 224a can be obtained by uniformly decreasing the amount of oxygen provided into a thin film in a region from the third interface S3 to the first interface S1. This generates oxygen vacancies when the ferroelectric layer 224 is formed using a chemical vapor deposition method or an atomic layer deposition method. According to another embodiment, the first region 224a may be obtained by uniformly depositing the ferroelectric layer 224 using a chemical vapor deposition method or an atomic layer deposition method. A surface treatment is performed on the ferroelectric layer 224 to generate the oxygen vacancies in the region from the third interface S3 to the first interface S1. The surface treatment may, for example, include plasma treatment. The surface treatment can generate oxygen vacancies by breaking the chemical bonds formed by oxygen in the ferroelectric layer 224.

FIG. 8 illustrates an electric field-polarization hysteresis loop 3000 of the ferroelectric layer 224 when an internal electric field E224 illustrated in FIG. 7 is formed in the ferroelectric layer 224. The electric field-polarization hysteresis loop 3000 may represent polarization formed in a ferroelectric layer 224, when the single ferroelectric layer 224 is disposed between the first and second electrodes 210 and 230 and the electric field applied across the ferroelectric layer 224 is changed. As an example, the electric field may be applied while varying the polarity and magnitude of a bias applied to the second electrode 230 while the first electrode 210 is grounded.

Referring to FIG. 8, the hysteresis loop 3000 may have a first coercive electric field Ec1, a second coercive electric field −Ec2, first remanent polarization Pr1, and second remanent polarization −Pr2. The first and second coercive electric fields Ec1 and −Ec2 is each a minimum electric field capable of switching the orientation of the polarization stored in the ferroelectric layer 224 in an opposite direction. As an example, when the ferroelectric layer 224 has the first remanent polarization Pr1, and when a negative electric field having a magnitude equal to or greater than the absolute value of the second coercive electric field −Ec2 is applied, the polarization orientation in the ferroelectric layer 224 can be switched to the opposite direction. As another example, when the ferroelectric layer 224 has the second remanent polarization −Pr2, and when a positive electric field having a magnitude equal to or greater than the first coercive electric field Ec1 is applied through the second electrode 230, the polarization orientation in the ferroelectric layer 224 can be switched to the opposite direction.

The first and second remanent polarization Pr1 and −Pr2 are polarizations that the ferroelectric layer 224 can maintain in a state in which no electric field is applied from outside. The first and second remanent polarization Pr1 and −Pr2 are polarizations formed in the ferroelectric layer 224 by applying a positive polarity bias or a negative polarity bias corresponding to a magnitude equal to or greater than the absolute value of the first and second saturation electric fields Es1 and −Es2 to the second electrode 230 and then removing the bias. That is, the first and second saturation electric fields Es1 and −Es2 are minimum electric fields applied through the second electrode 230 in order to obtain the first and second remanent polarizations Pr1 and −Pr2.

Meanwhile, the hysteresis loop 3000 of FIG. 8 comes from the first and second saturation polarization Ps1 and −Ps2 at a maximum polarization of the ferroelectric layer 224. That is, the maximum polarization results from a bias of a positive polarity or a negative polarity corresponding to a magnitude equal to or greater than the absolute value of the first and second saturation electric fields Es1 and −Es2 applied to the second electrode 230.

Referring to FIG. 8, a magnitude of the first remanent polarization Pr1 and a magnitude of the second remanent polarization −Pr2 may be substantially identical. On the other hand, an absolute value of the first coercive electric field Ec1 may be smaller than an absolute value of the second coercive electric field −Ec2. In addition, an absolute value of the first saturation electric field Es1 applied to obtain the first remanent polarization Pr1 may be smaller than an absolute value of the second saturation electric field −Es2 applied to obtain the second remanent polarization −Pr2. In this embodiment, since the internal electric field E224 formed in the ferroelectric layer 224 affects the hysteresis loop property of the ferroelectric layer 224, a pair of coercive electric fields having substantially the same absolute value can be converted into the first and second coercive electric fields Ec1 and −Ec2 having different absolute values as described above. In addition, the electric field E224 can convert a pair of saturation electric fields having substantially the same absolute value into the first and second saturation electric fields Es1 and −Es2 having different absolute values as described above.

According to an embodiment of the present disclosure, when the ferroelectric layer 224 has the hysteresis loop illustrated in FIG. 8 and an electric field having a positive polarity is applied to the ferroelectric layer 224 at a magnitude smaller than the absolute value of the first coercive electric field Ec1, the ferroelectric layer 224 can have a capacitance value obtained by dividing the absolute value of the first or second remanent polarization Pr1 or −Pr2 by the absolute value of the first coercive electric field Ec1 as a maximum value. Likewise, when an electric field having a negative polarity is applied to the ferroelectric layer 224 at a magnitude smaller than the absolute value of the second coercive electric field −Ec2, the ferroelectric layer 224 can have a capacitance defining a value obtained by dividing the absolute value of the first or second remanent polarization Pr1 or −Pr2 by the absolute value of the second coercive electric field −Ec2 as a maximum value.

Meanwhile, FIG. 9 illustrates the relationship between charge Q and energy U for a dielectric structure 220 in a semiconductor device 2 according to an embodiment of the present disclosure. A first graph 40c is a charge-energy graph for a non-ferroelectric layer 222, a second graph 50c is a charge-energy graph for a ferroelectric layer 224, and a third graph 60c is a charge-energy graph for the dielectric structure 220.

Referring to FIG. 9, in the second graph 50c, the ferroelectric layer 224 may have a pair of energy valleys each having a first energy U1c and a second energy U2c in a first charge amount Q1c and a second charge amount Q2c, respectively. The first energy U1c and the second energy U2c may have different values due to an internal electric field E224 formed in the ferroelectric layer 224.

Meanwhile, in substantially the same manner as the method of performing capacitance matching for the non-ferroelectric layer 222 and the ferroelectric layer 224 described above with reference to FIGS. 4A and 4B, the non-ferroelectric layer 222 and the ferroelectric layer 224 may be capacitance-matched to suppress the ferroelectric property of the ferroelectric layer 224 and to form the dielectric structure 220 having a capacitance greater than a capacitance of the non-ferroelectric layer 222. At this time, the dielectric structure 220 has a non-ferroelectric property. The ferroelectric layer 224 whose ferroelectric property is suppressed can perform a function of suppressing a leakage current passing through the dielectric structure 220.

In the third graph 60c, the dielectric structure 220 has a single energy valley having the lowest energy U3c at a third charge amount Q3c so that the dielectric structure 220 loses the ferroelectric property of the ferroelectric layer 224. The different polarization states of the layers of the dielectric structure can be switched.

This embodiment provides another method of performing capacitance matching for the non-ferroelectric layer 222 and the ferroelectric layer 224. In contrast to the comparative example described above with reference to FIGS. 3, 4A and 4B, the probability that the capacitance matching can be achieved can be increased. That is, an internal electric field of the ferroelectric layer 224 can be controlled by controlling a size of the first region 224a in the ferroelectric layer 224 and the concentration of oxygen vacancies in the first region 224a. The magnitudes of the remanent polarization and the coercive electric field on the hysteresis loop of the ferroelectric layer 224 can be changed by controlling the internal electric field. Accordingly, the ferroelectric property of the ferroelectric layer 224 in contact with the non-ferroelectric layer 222 can be variously controlled. As a result, the dielectric property of the dielectric structure 220 including the non-ferroelectric layer 222 and the ferroelectric layer 224 can be more effectively controlled.

Figure 10:
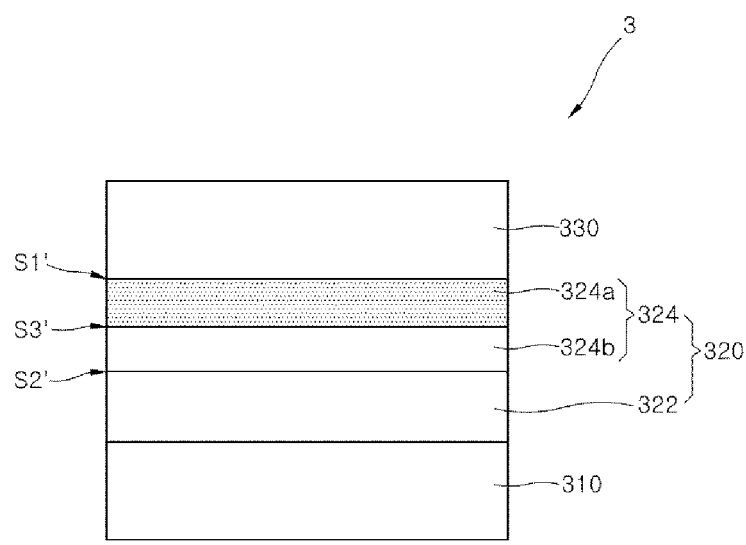
FIG. 10 is a cross-sectional view schematically illustrating a semiconductor device according to another embodiment of the present disclosure.
Figure 11:
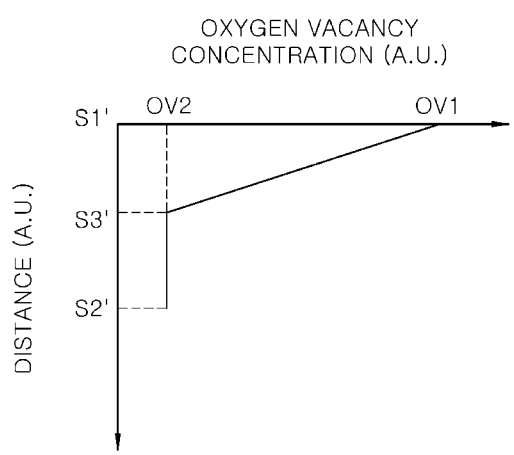
FIG. 11 a graph illustrating oxygen cavities in a ferroelectric layer of a semiconductor device according to an embodiment of the present disclosure.
Figure 12:
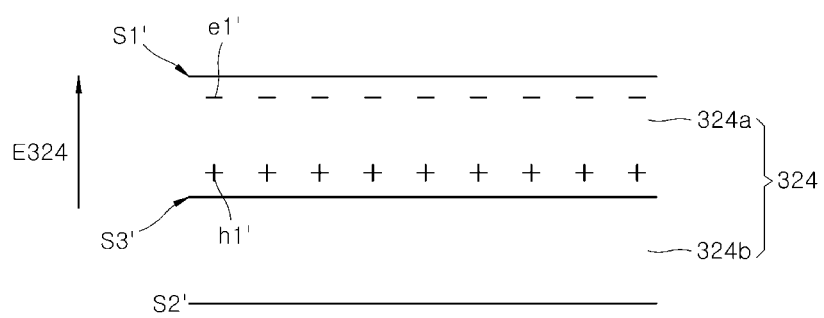
FIG. 12 is a view schematically illustrating an internal electric field due to the distribution of oxygen cavities in a ferroelectric layer of a semiconductor device according to an embodiment of the present disclosure.

FIG. 10 is a cross-sectional view schematically illustrating a semiconductor device according to another embodiment of the present disclosure. FIG. 11 a graph illustrating the distribution of oxygen cavities in a ferroelectric layer of the semiconductor device according to the embodiment of the present disclosure. FIG. 12 is a view schematically illustrating an internal electric field due to the distribution of oxygen cavities in the ferroelectric layer of the semiconductor device according to the embodiment of the present disclosure.

Referring to FIG. 10, the semiconductor device 3 may include a first electrode 310, a dielectric structure 320 and a second electrode 330. The dielectric structure 320 may include a non-ferroelectric layer 322 and a ferroelectric layer 324. The ferroelectric layer 324 may include a first region 324a and a second region 324b having different oxygen vacancy concentrations. The ferroelectric layer 324 and the second electrode 330 may form a first interface S1' and the non-ferroelectric layer 322 and the ferroelectric layer 324 may form a second interface S2'. The first region 324a and the second region 324b may form a third interface S3'.

Configurations of the first electrode 310, the non-ferroelectric layer 322, the ferroelectric layer 324 and the second electrode 330 of the semiconductor 3 may be substantially the same as configurations of the first electrode 210, the non-ferroelectric layer 222, the ferroelectric layer 224 and the second electrode 230 of the semiconductor device 2 described above with reference to FIGS. 5 to 9. However, the semiconductor device 3 can be differentiated from the semiconductor device 2 in that the first region 324a of the ferroelectric layer 324 has a concentration gradient of oxygen vacancy.

Referring to FIGS. 10 and 11, the first region 324a of the ferroelectric layer 324 may maintain a first oxygen vacancy value OV1 at the first interface S1'. The concentration of oxygen vacancies may be decreased from the first interface S1' to the third interface S3'. The first region 324a may have a second oxygen vacancy value OV2 smaller than the first oxygen vacancy value OV1 at the third interface S3'. In an embodiment, the second oxygen vacancy value OV2 may correspond to an inevitable minimum amount of oxygen vacancies that may be present in the ferroelectric layer 324. Meanwhile, the second region 324b of the ferroelectric layer 324 may maintain the second oxygen vacancy value OV2 from the third interface S3' to the second interface S2'.

According to an embodiment, the concentration gradient of oxygen vacancies in the first region 324a can be obtained by sequentially decreasing the amount of oxygen provided in a thin film from the third interface S3' to the first interface S1' when the first region 324a is formed by a chemical vapor deposition method or an atomic layer deposition method.

The ferroelectric layer 324 has the concentration distribution of oxygen vacancies illustrated in FIG. 11. High density trap sites are generated by the oxygen vacancies in the first region 324a. In addition, a concentration gradient of the trap sites can be generated by the concentration gradient of oxygen vacancies. As the trap sites can trap negative charge, polarization of a positive charge h1' and a negative charge e1' can be generated in the first region 324a, as illustrated in FIG. 12. An internal electric field E324 can be formed in the ferroelectric layer 324 due to the polarization. As an example, a thickness of the first region 324a may be about 1/10 to 1/20 of the thickness of the ferroelectric layer 324. The ratio of the first oxygen vacancy value OV1 to the second oxygen vacancy value OV2 may be at least 5 or greater.

According to this embodiment, the magnitudes of remanent polarization and coercive electric field of the ferroelectric layer 324 can be changed by the internal electric field E324 formed in the first region 324a. Accordingly, the ferroelectric property of the ferroelectric layer 324 in contact with the non-ferroelectric layer 322 can be variously controlled. As a result, the ferroelectric property of the dielectric structure 320 having the non-ferroelectric layer 322 and the ferroelectric layer 324 can be variously controlled. As an example, the dielectric structure 320 may have a non-ferroelectric property.

In some other embodiments, through forming the internal electric field E324 in the first region 324a, a method of generating a gradient of lattice strain in the first region 324a can be applied. The gradient of lattice strain can be implemented through a concentration gradient of the dopant implanted into the ferroelectric layer 324.

Figure 13:
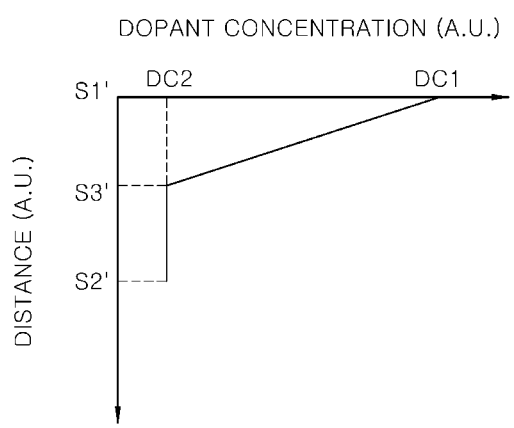
FIG. 13 is a graph illustrating a concentration gradient of a dopant in a ferroelectric layer of a semiconductor device according to another embodiment of the present disclosure.

FIG. 13 is a graph illustrating a concentration gradient of a dopant in a ferroelectric layer of a semiconductor device according to another embodiment of the present disclosure. Here, a size of the dopant may be different from a size of a constituent element binding to oxygen in the ferroelectric layer.

Referring to FIG. 13, the ferroelectric layer 324 may include a first region 324a having relatively high dopant concentration and a second region 324b having relatively low dopant concentration. The dopant implanted into the ferroelectric layer 324 may have a concentration gradient along a thickness direction of the first region 324a. As an example, the dopant concentration having a first dopant concentration value DC1 at a first interface S1' may be continuously decreased to a third interface S3' and may have a second dopant concentration value DC2 smaller than the first dopant concentration value DC1 at the third interface S3'. The second region 324b may have the second dopant concentration value DC2. The dopant implanted into the first region 324a may generate lattice strain in the ferroelectric material in the first region 324a. The lattice strain may generate a gradient along the thickness direction of the first region 324a, corresponding to the concentration gradient of the dopant. The gradient of the lattice strain can form an internal electric field by a flexoelectric effect.

Figure 14:
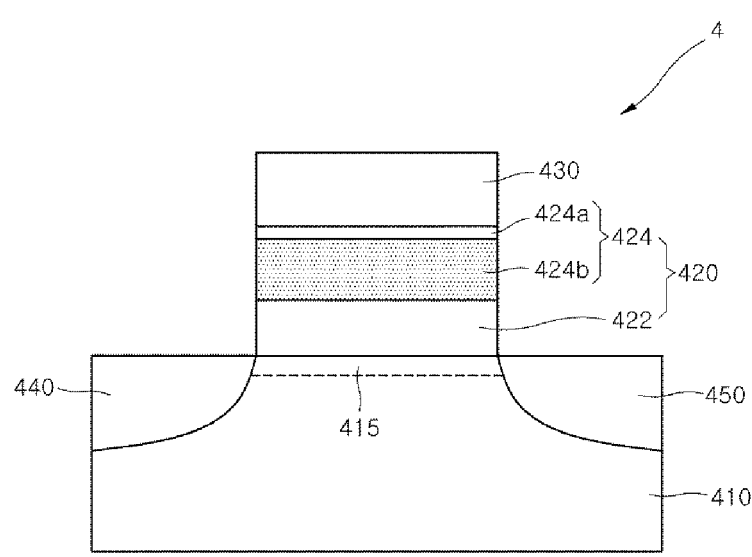
FIG. 14 is a cross-sectional view schematically illustrating a semiconductor device according to another embodiment of the present disclosure.

FIG. 14 is a cross-sectional view schematically illustrating a semiconductor device according to another embodiment of the present disclosure. Referring to FIG. 14, the semiconductor device 4 may include a substrate 410 having a channel region 415, a gate dielectric structure 420 and a gate electrode layer 430. In addition, the semiconductor device 4 may include a source region 440 and a drain region 450 with respect to the gate electrode layer 430. The semiconductor device 4 may be a field effect transistor.

The substrate 410 may, for example, include a semiconductor material. The substrate 410 may, for example, be a silicon (Si) substrate, a gallium arsenic (GaAs) substrate, an indium phosphide (InP) substrate, a germanium (Ge) substrate, or a silicon germanium (SiGe) substrate. In an embodiment, the semiconductor material may be doped to have conductivity. As an example, the semiconductor material may be doped with a n-type dopant or a p-type dopant.

The source region 440 and the drain region 450 may be regions doped with a doping type that is different from the doping type of the substrate 410. As an example, when the substrate 410 is doped with an n-type dopant, the source region 440 and the drain region 450 may be doped with a p-type dopant. As another example, when the substrate 410 is doped with a p-type dopant, the source region 440 and the drain region 450 may be doped with an n-type dopant.

The gate dielectric structure 420 may include a non-ferroelectric layer 422 and a ferroelectric layer 424. The ferroelectric layer 424 may include a first region 424a having relatively high oxygen vacancy concentration and a second region 424b having relatively low oxygen vacancy concentration.

A configuration of the gate dielectric structure 420 may be substantially the same as the configuration of the dielectric structure 220 of the embodiment described above with reference to FIGS. 5 to 9. That is, the configurations of the non-ferroelectric layer 422 and the first and second regions 424a and 424b of the ferroelectric layer 424 may be substantially the same as the configurations of the non-ferroelectric layer 222 and the first and second regions 224a and 224b of the ferroelectric layer 224 of the embodiment described above with reference to FIGS. 5 to 9.

The gate electrode layer 430 may include a conductive material. The conductive material may include, for example, tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, doped silicon, or a combination of two or more thereof.

In this embodiment, the gate dielectric structure 420, including the non-ferroelectric layer 422 and the ferroelectric layer 424, can be applied as a gate dielectric layer. Through capacitance matching for the non-ferroelectric layer 422 and the ferroelectric layer 424, it is possible to suppress the ferroelectric polarization characteristic of the ferroelectric layer 424 and to improve a capacitance of the gate dielectric structure 420 in reference to a capacitance of the non-ferroelectric layer 422. At this time, the gate dielectric structure 420 may have a non-ferroelectric property. The ferroelectric layer 424, whose ferroelectric characteristic is suppressed, can function to suppress a leakage current passing through the gate dielectric structure 420.

In this embodiment, the ferroelectric layer 424 can create positive and negative coercive electric fields having different absolute values due to an internal electric field generated by a concentration difference of the oxygen vacancies. As a result, the capacitance matching probability can be increased by increasing the number of cases in which matching with the non-ferroelectric layer 422 can be achieved. Thus, the semiconductor device including the gate dielectric structure disclosed has a higher probability for an improved capacitance.

Figure 15:
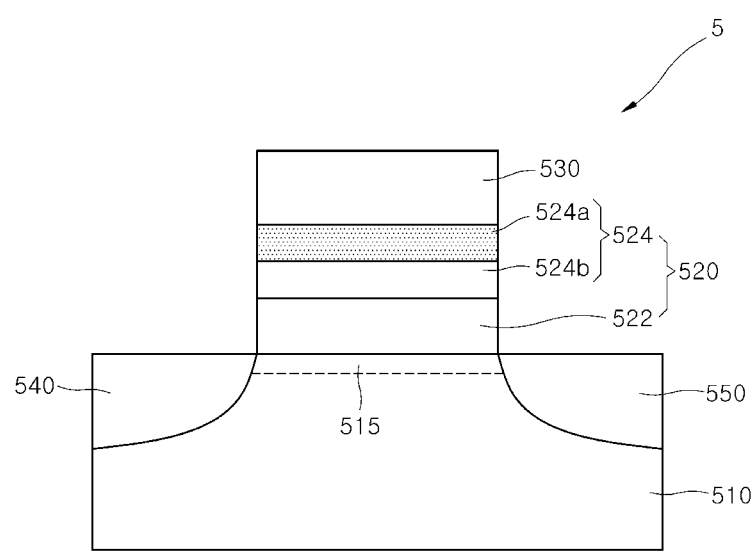
FIG. 15 is a cross-sectional view schematically illustrating another semiconductor device according to an embodiment of the present disclosure.

FIG. 15 is a cross-sectional view schematically illustrating another semiconductor device according to an embodiment of the present disclosure. Referring to FIG. 15, the semiconductor device 5 may include a substrate 510 having a channel region 515, a gate dielectric structure 520 and a gate electrode layer 530. In addition, the semiconductor device 5 may include a source region 540 and a drain region 550 that are disposed in the substrate 510 on opposite sides with respect to the gate electrode layer 530. The semiconductor device 5 may have substantially the same configuration as the semiconductor device 4 described above with reference to FIG. 14, except with respect to a configuration of the gate dielectric structure 520. That is, the configurations of the substrate 510, the source and drain regions 540 and 550 and the gate electrode layer 530 may be substantially the same as the configurations of the substrate 410, the source and drain regions 440 and 450 and the gate electrode layer 430 described above with reference to FIG. 14.

The gate dielectric structure 520 may include a non-ferroelectric layer 522 and a ferroelectric layer 524. The ferroelectric layer 524 may include a first region 524a having a relatively high oxygen vacancy concentration and a second region 524b having a relatively low oxygen vacancy concentration. The first region 524a may have a concentration gradient of oxygen vacancies.

A configuration of the gate dielectric structure 520 may be substantially the same as the configuration of the dielectric structure 320 of the embodiment described above with reference to FIGS. 10 to 12. That is, the configurations of the non-ferroelectric layer 522 and the first and second regions 524a and 524b of the ferroelectric layer 524 may be substantially the same as the configurations of the non-ferroelectric layer 322 and the first and second regions 324a and 324b of the ferroelectric layer 324 described above with reference to FIGS. 10 to 12.

In this embodiment, the gate dielectric structure 520 including the non-ferroelectric layer 522 and the ferroelectric layer 524 can be applied as a gate dielectric layer. Through effective capacitance matching for the non-ferroelectric layer 522 and the ferroelectric layer 524, it is possible to suppress the ferroelectric polarization characteristic of the ferroelectric layer 524 and to improve a capacitance of the gate dielectric structure 520 with respect to a capacitance of the non-ferroelectric layer 522. At this time, the gate dielectric structure 520 may have a non-ferroelectric property. The ferroelectric layer 524 whose ferroelectric characteristic is suppressed, can function to suppress a leakage current passing through the gate dielectric structure 520.

In this embodiment, the ferroelectric layer 524 can create positive and negative coercive electric fields having different absolute values due to the first region 524a having an internal electric field. As a result, the ferroelectric layer 524 can increase the number of cases in which matching with the non-ferroelectric layer 522 can be achieved, thereby increasing the probability of the matching. Thus, a semiconductor device including a gate dielectric structure having an improved capacitance can be provided.

Furthermore, in an embodiment of the disclosure, a gate dielectric structure is disposed on a channel region of a substrate of the device. The gate dielectric structure includes a ferroelectric layer and a non-ferroelectric layer. The ferroelectric layer has a first region and a first region thickness generated by a first region concentration gradient of oxygen vacancies which trap negative charge and polarize a corresponding positive charge and generate an internal electric field. The gate dielectric structure has a paraelectric property and a controlled capacitance by the capacitance matching of the ferroelectric layer and the non-ferroelectric layer.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A semiconductor device comprising:
a first electrode;
a dielectric structure disposed on the first electrode and having a ferroelectric layer and a non-ferroelectric layer; and
a second electrode disposed on the dielectric structure,
wherein the ferroelectric layer has positive and negative coercive electric fields having different absolute values, and,
wherein the dielectric structure has a non-ferroelectric property.

2. The semiconductor device of claim 1,
wherein the non-ferroelectric layer has a paraelectric property.

3. The semiconductor device of claim 1,
wherein the absolute value of the positive coercive electric field is less than the absolute value of the negative coercive electric field.

4. The semiconductor device of claim 1,
wherein the ferroelectric layer comprises at least one selected from the group consisting of hafnium oxide, zirconium oxide and hafnium zirconium oxide.

5. The semiconductor device of claim 1,
wherein the non-ferroelectric layer comprises at least one selected from the group consisting of silicon oxide, silicon nitride, silicon oxynitride, aluminum oxide, hafnium oxide, zirconium oxide and hafnium zirconium oxide.

6. The semiconductor device of claim 1,
wherein the non-ferroelectric layer and the ferroelectric layer are sequentially stacked between the first electrode and the second electrode.

7. The semiconductor device of claim 1,
wherein the ferroelectric layer comprises a first region adjacent to the second electrode and a second region outside the first region,
wherein the second region is distal the second electrode and proximal the first region, and
wherein a concentration of oxygen vacancy of the first region is higher than a concentration of oxygen vacancy of the second region.

8. The semiconductor device of claim 7,
wherein the first region has a concentration gradient of oxygen vacancy.

9. The semiconductor device of claim 1,
wherein the ferroelectric layer comprises a dopant,
wherein the ferroelectric layer comprises a first region having a relatively high concentration of the dopant and a second region having a relatively low concentration of the dopant, and
wherein the first region has a concentration gradient of the dopant.

10. A semiconductor device comprising:

a substrate having a channel region;

a gate dielectric structure disposed on the channel region and including a ferroelectric layer and a non-ferroelectric layer; and a gate electrode layer disposed on the gate dielectric structure, wherein the ferroelectric layer has a positive and a negative coercive electric field having different absolute values, and wherein the gate dielectric structure has a non-ferroelectric property.

11. The semiconductor device of claim 10, wherein the non-ferroelectric layer has a paraelectric property.

12. The semiconductor device of claim 10, wherein the absolute value of the positive coercive electric field is less than the absolute value of the negative coercive electric field.

13. The semiconductor device of claim 10, wherein the ferroelectric layer comprises at least one selected from the group consisting of ferroelectric hafnium oxide, ferroelectric zirconium oxide, and ferroelectric hafnium zirconium oxide.

14. The semiconductor device of claim 10, wherein the non-ferroelectric layer comprises at least one selected from the group consisting of silicon oxide, silicon nitride, silicon oxynitride, aluminum oxide, paraelectric hafnium oxide, paraelectric zirconium oxide, and paraelectric hafnium zirconium oxide.

15. The semiconductor device of claim 10, wherein the non-ferroelectric layer is disposed on the channel region, and wherein the ferroelectric layer is disposed on the non-ferroelectric layer.

16. The semiconductor device of claim 10, wherein the ferroelectric layer comprises a first region disposed in an inner region adjacent to the second electrode, and a second region outside the first region, wherein the second region is distal the second electrode and proximal the first region, and wherein a concentration of oxygen vacancy of the first region is higher than a concentration of oxygen vacancy of the second region.

17. The semiconductor device of claim 16, wherein the first region has a concentration gradient of oxygen vacancy.

18. The semiconductor device of claim 10, wherein the ferroelectric layer comprises a dopant, wherein the ferroelectric layer comprises a first region having a relatively high concentration of the dopant and a second region having a relatively low concentration of the dopant, and wherein the first region has a concentration gradient of the dopant.

19. A semiconductor device comprising:

a gate dielectric structure disposed on a channel region of a substrate of the device, the gate dielectric structure including a ferroelectric layer and a non-ferroelectric layer; and wherein the ferroelectric layer has a first region and a first region thickness generated by a first region concentration gradient of oxygen vacancies which trap negative charge and polarize a corresponding positive charge and generate an internal electric field, wherein the gate dielectric structure has a paraelectric property and a controlled capacitance by a capacitance matching of the ferroelectric layer and the non-ferroelectric layer.

20. The semiconductor device of claim 19, wherein the ferroelectric layer further has a suppressed ferroelectric polarization characteristic through the capacitance matching to suppress a leakage current passing through the gate dielectric structure.

* * * * *